(12) United States Patent
Li

(10) Patent No.: US 9,917,547 B2
(45) Date of Patent: Mar. 13, 2018

(54) VOLTAGE CONTROLLED OSCILLATOR

(71) Applicant: Hao Li, Poing (DE)

(72) Inventor: Hao Li, Poing (DE)

(73) Assignee: NXP USA, Inc., Austin, TX (US)

( * ) Notice: Subject to any disclaimer, the term of this patent is extended or adjusted under 35 U.S.C. 154(b) by 273 days.

(21) Appl. No.: 14/651,238

(22) PCT Filed: Jan. 9, 2013

(86) PCT No.: PCT/IB2013/050194
§ 371 (c)(1),
(2) Date: Jun. 11, 2015

(87) PCT Pub. No.: WO2014/108745
PCT Pub. Date: Jul. 17, 2014

(65) Prior Publication Data
US 2015/0333695 A1    Nov. 19, 2015

(51) Int. Cl.
*H03B 5/12* (2006.01)
*G01S 7/02* (2006.01)
(Continued)

(52) U.S. Cl.
CPC ............. *H03B 5/1206* (2013.01); *G01S 7/02* (2013.01); *H03B 5/1209* (2013.01);
(Continued)

(58) Field of Classification Search
CPC .... G01S 7/02; G01S 7/03; H03B 5/08; H03B 5/12; H03B 5/1206; H03B 5/1209;
(Continued)

(56) References Cited

U.S. PATENT DOCUMENTS 3,462,690 A * 8/1969 Pelka ................... H03B 5/1847
3,569,865 A * 3/1971 Healey, III ............ H03C 3/222
                                                              331/116 R
(Continued)

FOREIGN PATENT DOCUMENTS

KR    20070061233    6/2007

OTHER PUBLICATIONS nternational Search Report and Written Opinion correlating to PCT/IB2013/050194 dated Aug. 27, 2013.
(Continued)

*Primary Examiner* — Bernarr E Gregory

(57) ABSTRACT

A voltage controlled oscillator (VCO) comprising a first supply node, a second supply node, an oscillation transistor, a biasing network, an output node and a feedback network is described. The VCO is be powered by a supply voltage applied across the first and second supply nodes. The oscillation transistor and the biasing network are connected in series between the first supply node and the second supply node. The output node is connected to the oscillation transistor so as to deliver an oscillatory output signal. The feedback network provides an oscillatory feedback signal from the output node to the biasing network. The feedback network comprises a capacitive element and a transmission line connected in series for transferring the feedback signal. The VCO may be integrated in a radar device, for example.

18 Claims, 3 Drawing Sheets

(51) Int. Cl.
   *H03B 5/18*    (2006.01)
   *H03B 5/00*    (2006.01)
   *G01S 13/00*   (2006.01)

(52) U.S. Cl.
   CPC ......... *H03B 5/1231* (2013.01); *H03B 5/1243* (2013.01); *H03B 5/18* (2013.01)

(58) Field of Classification Search
   CPC .... H03B 5/1231; H03B 5/1237; H03B 5/124;
       H03B 5/1243; H03B 5/18; H03B 17/00;
       H03B 5/1847; H03B 5/1852; H05K 1/16;
       H03C 3/10; H03C 3/12; H03C 3/22;
       H03C 3/222; H03L 7/06; H03L 7/08;
       H03L 7/10; H03L 7/12; H04B 1/0475
   See application file for complete search history.

(56) References Cited

U.S. PATENT DOCUMENTS

| | | | | |
|---|---|---|---|---|
| 3,935,541 | A * | 1/1976 | Amend | H03L 7/12 |
| | | | | 331/25 |
| 4,066,981 | A * | 1/1978 | Levine | H03B 17/00 |
| | | | | 330/109 |
| 4,375,621 | A * | 3/1983 | Schneiter et al. | H03B 5/1847 |
| 4,638,264 | A * | 1/1987 | Ueno | H03B 5/1847 |
| 4,721,926 | A * | 1/1988 | Aota | H03B 5/1847 |
| 4,721,927 | A * | 1/1988 | Aota et al. | H03B 5/1847 |
| 5,532,651 | A * | 7/1996 | Jager et al. | H03B 5/1852 |
| 5,714,914 | A * | 2/1998 | Zhou | H03B 1/1847 |
| 5,740,522 | A * | 4/1998 | Dolman et al. | H04B 1/0475 |
| 5,821,820 | A | 10/1998 | Snider et al. | |
| 6,188,295 | B1 * | 2/2001 | Tsai | H05K 1/16 |
| | | | | 331/108 D |
| 6,326,854 | B1 | 12/2001 | Nicholls et al. | |
| 6,456,169 | B2 * | 9/2002 | Oshita | H03B 5/1243 |
| | | | | 331/108 D |
| 6,466,099 | B2 * | 10/2002 | Festag | H03B 5/1243 |
| | | | | 331/117 R |
| 8,289,093 | B2 * | 10/2012 | Tsuda | H03B 5/1243 |
| | | | | 331/116 FE |
| 8,441,324 | B2 * | 5/2013 | Li | H03B 5/1243 |
| | | | | 331/117 D |
| 8,446,228 | B2 | 5/2013 | Trotta | |
| 8,547,183 | B2 * | 10/2013 | Yamakawa | H03B 5/1243 |
| | | | | 331/117 FE |
| 8,830,007 | B1 * | 9/2014 | Gamliel | H03B 5/1243 |
| | | | | 331/117 FE |
| 2002/0084860 | A1 * | 7/2002 | Festag | H03B 5/1243 |
| | | | | 331/117 R |
| 2004/0095198 | A1 * | 5/2004 | Yeh | H03B 5/1243 |
| | | | | 331/117 R |
| 2004/0150481 | A1 * | 8/2004 | Aramata et al. | H03B 5/1847 |
| 2005/0128015 | A1 * | 6/2005 | Aramata et al. | H03B 5/1847 |
| 2006/0279368 | A1 * | 12/2006 | Rohde | H03B 5/1243 |
| | | | | 331/167 |
| 2011/0018597 | A1 | 1/2011 | Lee et al. | |

OTHER PUBLICATIONS

Liu, Peng et al. "Low Phase Noise Load Independent Switched LC VCO", Microwave Symposium Digest (MTT), 2010 IEEE MTT-S International, pp. 280-283.

* cited by examiner

VOLTAGE CONTROLLED OSCILLATOR

FIELD OF THE INVENTION

This invention relates to a voltage controlled oscillator.

BACKGROUND OF THE INVENTION

A voltage controlled oscillator (VCO) is an electronic circuit for generating a periodic oscillatory output signal, e.g., an oscillatory voltage or current, the output signal having an oscillation frequency that is adjustable by means of a tuning voltage applied at a varactor in the VCO core. The oscillation frequency (also referred to as the oscillator frequency or VCO frequency) may be varied or modulated by varying this tuning voltage. VCOs may notably be used in high frequency applications such as communication and sensor systems.

One of the most important VCO signal quality parameters is the phase noise. Phase noise is a variable and unpredictable deviation of the phase of the VCO output signal and is usually undesired. Phase noise can limit the performance of an application system, and it can be one of the most critical parameters.

It has been proposed to include a current source in a VCO in order to make the VCO design robust against process and temperature variation, and also to avoid self-biasing in the VCO core. The introduction of a current source in the VCO core may, however, increase the level of VCO phase noise due to noise sources in the current source.

SUMMARY OF THE INVENTION

The present invention provides a voltage controlled oscillator as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
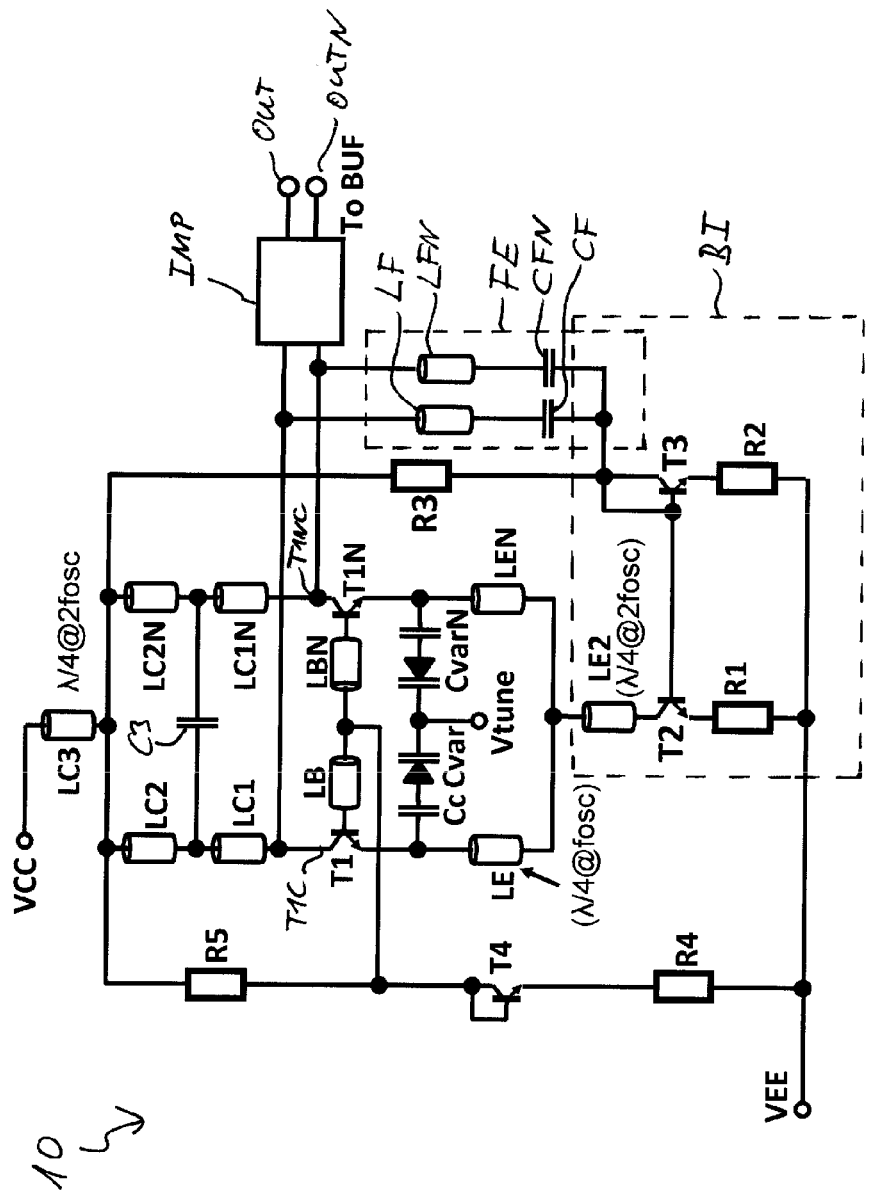
FIG. 1 schematically shows an example of an embodiment of a VCO.
Figure 3:
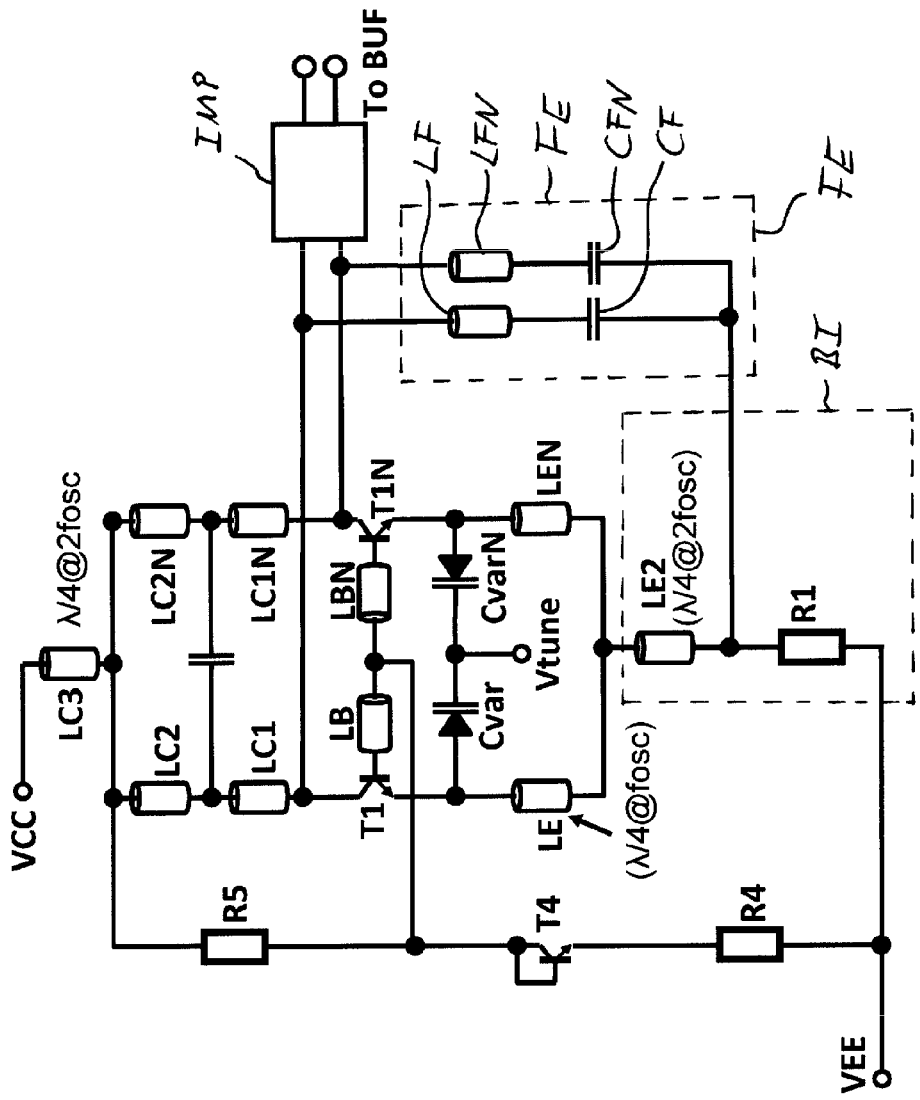
FIG. 3 schematically shows an example of an embodiment of a VCO.

FIGS. 1 and 3 illustrate a first and second example of a VCO 10, respectively. The VCO 10 has a voltage controlled oscillator frequency. The VCO 10 may notably comprise a first supply node VCC, a second supply node VEE, an oscillation transistor T1, a biasing network BI, an output node T1C, and a feedback network FE. The VCO 10 may be of the Colpitts type.

In the shown example, the VCO 10 may comprise a first group of components and a second group of components that are arranged symmetrically with respect to each other to produce a differential output signal, e.g., the voltage between nodes T1C and T1NC. Each component of the first group may have a counterpart component in the second group. In the shown example, the first group notably comprises the components LC2, LC1, T1, LB, Cvar, LE, LF, and CF, while the second group comprises the corresponding counterpart components LC2N, LC1N, T1N, LBN, CvarN, LEN, LFN, and CFN.

The VCO 10 may be arranged to be powered by a supply voltage applied across the first and second supply nodes VCC and VEE. The supply voltage may be a direct current (DC) voltage.

The oscillation transistor T1 or the pair of transistors T1, T1N and the biasing network BI may be connected in series between the first supply node VCC and the second supply node VEE. In the shown example, the oscillation transistor T1 is a bipolar transistor. In an alternative example (not shown), the oscillation transistor T1 may be a field effect transistor. The output node may, for example, be the collector TC1 of the oscillation transistor T1 (in the case of a bipolar transistor) or the source of the oscillation transistor (in the case of a field effect transistor). In the shown example, a counterpart output node is provided by the collector T1NC of the transistor T1N that is the counterpart of the first oscillation transistor T1, and the output signal may be the voltage between the output nodes T1C and T1NC. In an alternative example, the VCO 10 may be of an asymmetrical or non-differential design. The output signal may then be the voltage between the output node T1C and a ground node. The ground node may, for example, be provided by one of the two supply nodes VCC and VEE. More generally, the output node (T1C in the present example) may be connected to the oscillation transistor T1 so as to deliver an oscillatory output signal that has the oscillator frequency. The output signal may be a voltage or a current. The oscillator frequency may be above 1 gigahertz or even above 10 gigahertz. The oscillator frequency may, for example, be 77 gigahertz, a frequency commonly used in automotive radar devices.

The feedback network FE may provide an oscillatory feedback signal from, e.g., the output node T1C to the biasing network BI. The feedback network FE may comprise a capacitive element CF and a transmission line LF connected in series for transferring the feedback signal to the biasing network BI. The feedback signal may thus be synchronized with the VCO output signal to achieve a fast switching on and off of the oscillation transistor T1 (in a non-differential design) or the pair of oscillation transistors T1 and T1N (in a differential design). The turn on and off time of the oscillation transistors of T1 and T1N may thus be reduced. A contribution of T1 and T1N shot noise to the VCO phase noise may hence be reduced accordingly. A noise contribution of other components of the VCO 10 may also decrease.

The VCO 10 may, for example, have an oscillation frequency of 38.5 GHz, the capacitive element CF may have a capacitance of, e.g., about 1.5 pF and the transmission line LF may have a length of, e.g., about 1900 micrometers (um). The VCO 10 may, for example, be connected to a frequency doubler circuit (not shown) to generate a frequency-doubled signal having a frequency of, e.g., 77 GHz. The frequency-doubled signal may be used in a 77 GHz radar application, for example.

The capacitive element CF may be implemented on chip, e.g., using Metal-Isolation-Metal (MIM) or metal-oxide-semiconductor (MOS) capacitors. The transmission line LF in the feedback network may behave as an inductance and may be implemented on chip using, e.g., a single metal wire over a ground plane, a pair of metal wires over a ground plane, a coplanar transmission line, or, in a certain GHz range, one or more spiral inductors.

In the examples of FIGS. 1 and 3, the oscillation transistors T1 and T1N may have their bases interconnected via transmission lines LB and LBN, and their emitters interconnected via one or more capacitive elements, e.g., capacitive elements CC, CCN, Cvar, CvarN. The capacitive elements Cvar and CvarN may be varactors having a voltage controlled capacitance. The oscillator frequency may thus be controlled by varying the capacitance of the varactors Cvar and CvarN by means of the control voltage Vtune. The network of components LB, T1, CC, Cvar, and their counterparts LBN, T1N CCN, and CvarN may be considered the core of the VCO 10. The feedback signal that is fed back to the VCO core may notably reduce the phase noise contributions of the various components of the VCO core and notably the contributions of the transmission lines LB and LBN and of Cvar and CvarN. The incorporation of the feedback network FE in VCO 10 may also increase the oscillation amplitude which may further reduce the phase noise.

The VCO 10 may further comprise a network of inductive and capacitive elements LC1, LC1N, LC2, LC2N, and C3 with a high side connected to the first supply node VCC and a second side connected to the oscillation transistors T1 and T1N. A quarter wavelength transmission line LC3 may be connected between the first supply node VCC and the rest of the circuit. Furthermore, resistive elements R1, R2, R3, R4, and R5 and transistors T2, T3 and T4 may be provided for setting various voltage levels at various nodes within the circuit. For example, the resistive elements R4 and R5 may be arranged to provide a voltage divider between the first supply node VCC and the second supply node VEE so as to provide a bias voltage to the control terminals (e.g., basis terminals or gate terminals) of the oscillation transistors T1 and T1N. The voltage divider may further comprise a diode T4 connected in series with the resistive elements R4 and R5. The diode T4 may be provided in the form of a bipolar transistor having its based shorted to its collector.

The VCO 10 may further comprise an impedance transformer IMP connected between, e.g., the differential output T1C, T1NC of the oscillation transistors T1 and T1N and a differential output terminal OUT, OUTN of the VCO 10. The differential output terminal OUT, OUTN may, for example, be connected to a buffer (not shown). The impedance transformer may be designed such that it has a high input impedance, i.e., loading of the tank, so as to avoid degrading the tank quality factor. The tank quality factor may be determined mainly by a quality factor of the varactor and the transmission line in the VCO 10 and also by the base resistance of the oscillation transistors T1 and T1N. In the example of FIG. 3, the biasing network BI does not comprise any current source. In the example of FIG. 1, in contrast, the biasing network BI may comprise a transistor T2 and a transistor T3 acting as a first current source and a second current source, respectively. The VCO 10 may further comprise one or more transmission lines. The transmission lines may notably comprise transmission lines LC3, LE, LEN, LB, LBN, LE2, LF, and LFN. The electrical length of each transmission line may be chosen to achieve a desired oscillation frequency, the lowest phase noise and optimum phase shift between its respective ends.

It is thus proposed to introduce a LC feedback network in a VCO. A fast switching on and off of the oscillation transistors may thus be achieved. The turn on and turn off times of the oscillation transistors may be significantly reduced, and the signal amplitude in the VCO core may become large. Shot noise contribution to phase noise may thereby be reduced. Furthermore, the large oscillation amplitude may also reduce the VCO phase noise. The feedback network may comprise the transmission line LF and the capacitive element CF in a non-differential design, or a pair of transmission lines LF, LFN and a pair of capacitive elements CF, CFN in a differential design. The capacitance of the capacitive element or the electrical length of the transmission line may be optimized to achieve a high input impedance and a correct, i.e., synchronized, phase relationship between the original signal, i.e., the VCO output signal, and the feedback signal.

Figure 2:
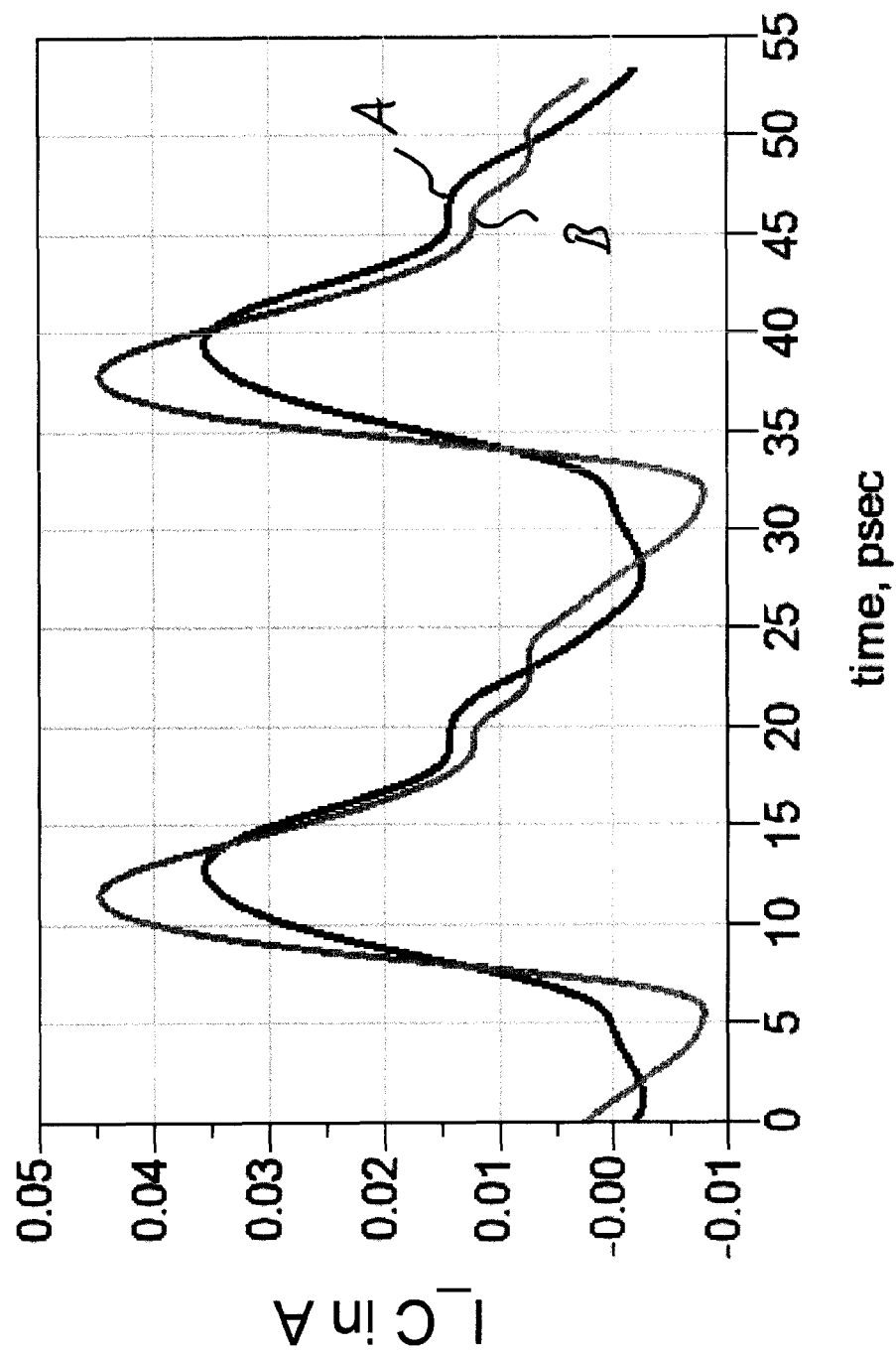
FIG. 2 shows a plot of a collector current as a function of time for two different VCOs.

Referring now to FIG. 2, the collector current of the oscillation transistor T1 (or equivalently of the second oscillation transistor T1N) is plotted as a function of time T. The time T is given in picoseconds (ps). The current is given in amperes. Graph A refers to a VCO identical to the one described above in reference to FIG. 1, but lacking the feedback network FE. Graph B refers to the VCO 10 described above in reference to FIG. 1. The feedback network FE in the VCO 10 was found to yield a reduction of the noise contribution of the oscillation transistors, an increase of the oscillation amplitude in the VCO core and a reduction of the noise contribution of the transmission lines LB and LBN and of the varactors Cvar and CvarN. A total phase noise reduction of approximately two decibels has been observed.

In the foregoing specification, the invention has been described with reference to specific examples of embodiments of the invention. It will, however, be evident that various modifications and changes may be made therein without departing from the broader spirit and scope of the invention as set forth in the appended claims.

Although specific conductivity types or polarity of potentials have been described in the examples, it will be appreciated that conductivity types and polarities of potentials may be reversed.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A voltage-controlled oscillator (VCO) having a voltage controlled oscillator frequency,
    wherein the VCO comprises a first supply node, a second supply node, an oscillation transistor, a biasing network, an output node, and a feedback network;
    the VCO is coupled to a first supply voltage at the first supply node and a second supply voltage at the second supply node;
    the oscillation transistor and the biasing network are connected in series between the first supply node and the second supply node;
    the output node is connected to the oscillation transistor so as to provide an oscillatory output signal which has said oscillator frequency;
    the feedback network is arranged to provide an oscillatory feedback signal from the output node to the biasing network; and
    the feedback network comprises a capacitive element and a transmission line connected in series for transferring the feedback signal.

2. The VCO of claim 1, wherein the biasing network comprises a current source.

3. The VCO of claim 1, wherein the current source comprises a transistor connected between the second supply node and the oscillation transistor.

4. The VCO of claim 1, wherein the VCO is of the Colpitts type.

5. The VCO of claim 1, wherein the oscillation transistor is a bipolar transistor having a collector connected to the first supply node and an emitter connected to the bias network.

6. The VCO of claim 5, comprising a first transmission line and a second transmission line connected in series, the first transmission line having an electrical length of one quarter wavelength for the oscillator frequency, the second transmission line having an electrical length of one quarter wavelength for twice the oscillator frequency, the first transmission line being connected to the emitter of the oscillation transistor, the second transmission line being connected between the first transmission line and the biasing network.

7. The VCO of claim 1, comprising a first group of components and a second group of components, wherein the first group and the second group are arranged symmetrically with respect to each other, each component of the first group having a counterpart component in the second group, the first group of components comprising said oscillation transistor as a first oscillation transistor, said second group of components comprising a second oscillation transistor as the counterpart component of the first oscillation transistor.

8. The VCO of claim 1, wherein the feedback signal is synchronized with said output signal to achieve a fast switching on and off of the oscillation transistor.

9. The VCO of claim 1, where the oscillator frequency is above 1 GHz.

10. A radar device comprising:
    a voltage-controlled oscillator including a first supply node, a second supply node, an oscillation transistor, a biasing network, an output node, and a feedback network;
    the VCO is coupled to a first supply voltage at the first supply node and a second supply voltage at the second supply node;
    the oscillation transistor and the biasing network are connected in series between the first supply node and the second supply node;
    the output node is connected to the oscillation transistor so as to provide an oscillatory output signal which has said oscillator frequency;
    the feedback network is arranged to provide an oscillatory feedback signal from the output node to the biasing network; and
    the feedback network comprises a capacitive element and a transmission line connected in series for transferring the feedback signal.

11. The radar device of claim 10, wherein the biasing network comprises a current source.

12. The radar device of claim 10, wherein the current source comprises a transistor connected between the second supply node and the oscillation transistor.

13. The radar device of claim 10, wherein the VCO is of the Colpitts type.

14. The radar device of claim 10, wherein the oscillation transistor is a bipolar transistor having a collector connected to the first supply node and an emitter connected to the bias network.

15. The radar device of claim 14, comprising a first transmission line and a second transmission line connected in series, the first transmission line having an electrical length of one quarter wavelength for the oscillator frequency, the second transmission line having an electrical length of one quarter wavelength for twice the oscillator frequency, the first transmission line being connected to the emitter of the oscillation transistor, the second transmission line being connected between the first transmission line and the biasing network.

16. The radar device of claim 10, comprising a first group of components and a second group of components, wherein the first group and the second group are arranged symmetrically with respect to each other, each component of the first group having a counterpart component in the second group, the first group of components comprising said oscillation transistor as a first oscillation transistor, said second group of components comprising a second oscillation transistor as the counterpart component of the first oscillation transistor.

17. The VCO of claim 10, wherein the feedback signal is synchronized with said output signal to achieve a fast switching on and off of the oscillation transistor.

18. The VCO of claim 10, where the oscillator frequency is above 1 GHz.

* * * * *